United States Patent
Chen et al.

(10) Patent No.: US 6,788,507 B2
(45) Date of Patent: Sep. 7, 2004

(54) ELECTROSTATIC DISCHARGE PROTECTION CIRCUIT

(75) Inventors: Shiao-Shien Chen, Chung-Li (TW); Tien-Hao Tang, Taipei Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 354 days.

(21) Appl. No.: 10/063,074

(22) Filed: Mar. 17, 2002

(65) Prior Publication Data

US 2003/0174452 A1 Sep. 18, 2003

(51) Int. Cl.[7] .............................................. H02H 9/00
(52) U.S. Cl. ........................................ 361/56; 257/494
(58) Field of Search ..................... 361/56, 91.1, 91.5, 361/90, 91.6, 111, 119; 257/355–357, 494, 551

(56) References Cited

U.S. PATENT DOCUMENTS

| | | | | |
|---|---|---|---|---|
| 5,130,760 A | * | 7/1992 | Matzen et al. | 257/605 |
| 5,500,546 A | * | 3/1996 | Marum et al. | 257/358 |
| 5,631,793 A | * | 5/1997 | Ker et al. | 361/56 |
| 5,691,554 A | * | 11/1997 | Matthews | 257/328 |
| 5,856,694 A | * | 1/1999 | Kurachi | 257/360 |
| 6,274,909 B1 | * | 8/2001 | Chang et al. | 257/355 |

* cited by examiner

Primary Examiner—Ronald Leja
(74) Attorney, Agent, or Firm—Winston Hsu (57) ABSTRACT

An electrostatic discharge (ESD) protection circuit formed on a P-type substrate. The ESD protection circuit is disposed between a bonding pad and an internal circuit formed on a P-type substrate, and has a P-type metal-oxide semiconductor (PMOS) and an N-type metal-oxide semiconductor (NMOS). The PMOS has a first doped region formed below a P+ guard ring of the PMOS and a well pick-up of the PMOS. The NMOS has second doped region formed below a N+ guard ring of the NMOS and a well pick-up of the NMOS. An equivalent zener diode is formed on the P-type substrate. A breakdown of the equivalent zener diode restricts the PMOS or the NMOS from producing a snap-back breakdown.

20 Claims, 7 Drawing Sheets

ELECTROSTATIC DISCHARGE PROTECTION CIRCUIT

BACKGROUND OF INVENTION

1. Field of the Invention

The present invention relates to a protection circuit, and more particularly, to an electrostatic discharge (ESD) protection circuit.

2. Description of the Prior Art

Electrostatic discharge (ESD) usually occurs in semiconductor devices. The ESD phenomenon occurs when excess charges are transmitted from the input/output (I/O) pin to the integrated circuit too quickly, damaging the internal circuit. To solve such a problem, manufacturers normally build an electrostatic discharge (ESD) protection circuit between the internal circuit and the I/O pin. The ESD protection circuit is initiated before the pulse of electrostatic discharge enters the internal circuit, discharging the excess charges, and thus ESD-related damage is decreased.

With the continuing scaling-down of semiconductor integrated circuit (IC) device dimensions, not only are channel lengths being shortened, gate oxide layers becoming thinner, and junction depths getting shallower, but also dopant concentrations of wells are rising in deep sub-micron complementary metal-oxide-semiconductor (CMOS) processes. All of these developments make IC products more susceptible to damage from electrostatic discharge. Consequently, more effective ESD protection circuits need to be built on-chip to discharge ESD-induced currents, and hence protect the IC against any ESD-related damage. In short, ESD robustness for IC products needs to be improved. To make an effective ESD protection circuit, an adequate ESD protection device must first be designed and manufactured into the ESD protection circuit. A very direct and effective solution is to increase the discharge path for ESD-induced current by enlarging the area of ESD protection device. However, the chip area occupied by the ESD protection device should not be excessive, lest the ESD protection device prevent further size reductions of the chip.

Figure 1:
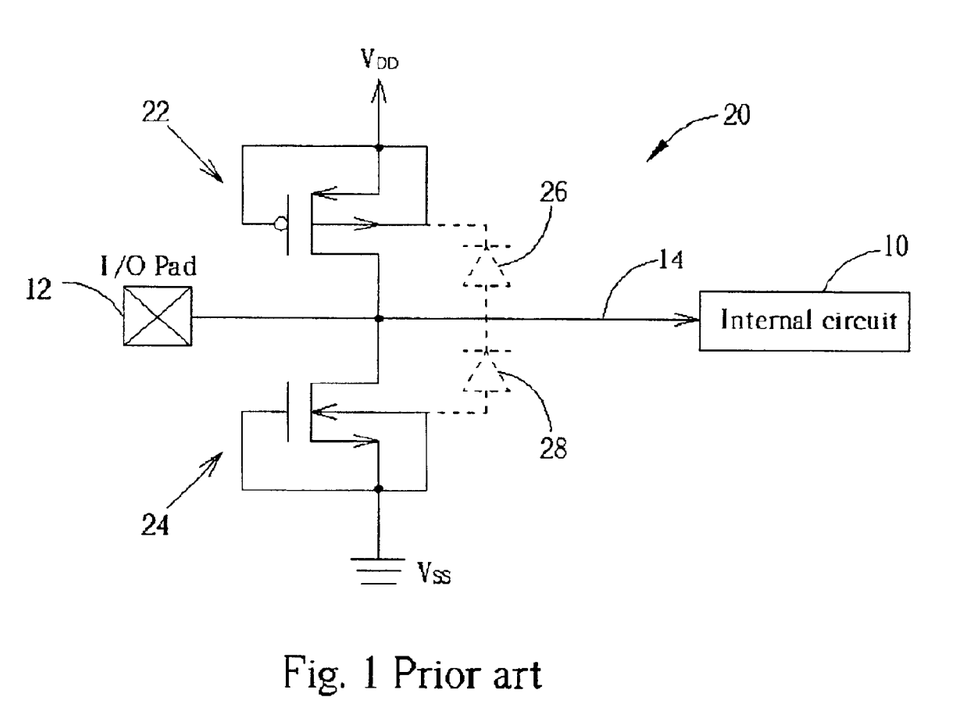
FIG. 1 is a circuit diagram of a prior art ESD protection circuit for protecting an internal circuit.

The prior art method of preventing electrostatic breakdown caused by electrostatic pulse is to utilize a parasitic diode in a metal-oxide semiconductor field effect transistor (MOSFET) as an ESD protection device. Please refer to FIG. 1. FIG. 1 is a circuit diagram of a prior art ESD protection circuit 20 for protecting an internal circuit 10. As shown in FIG. 1, the ESD protection circuit 20 is electrically connected between the internal circuit 10 and a bonding pad 12. The bonding pad 12 is utilized as a medium of electronic signals between the outside and the internal circuit 10. When electrostatic charges enter the internal circuit 10 through the bonding pad 12, the ESD protection circuit 20 protects the internal circuit 10 from being burnt-out due to the high electrostatic current. The ESD protection circuit 20 comprises a P-type metal-oxide semiconductor (PMOS) 22 and an N-type metal-oxide semiconductor (NMOS) 24. The drains of the PMOS 22 and NMOS 24 are tied together and connected to the internal circuit 10 and the bonding pad 12 via a conducting wire 14. The source of the PMOS 22 is connected to both the gate of the PMOS 22 and a $V_{DD}$ power terminal. The source of the NMOS 24 is connected to both the gate of the NMOS 24 and a $V_{SS}$ power terminal. A first parasitic diode 26 is formed in the PMOS 22 and a second parasitic diode 28 is formed in the NMOS 24.

When an ESD voltage is applied on the ESD protection circuit 20, across any two of the $V_{DD}$ power terminal, the bonding pad 12, and the $V_{SS}$ power terminal to produce ESD current, the ESD current is quickly discharged through the turned on first parasitic diode 26, the turned on second parasitic diode 28, the snapback breakdown of PMOS 22, or the snapback breakdown of NMOS 24. For example, when an user carrying electrostatic charges contacts the $V_{DD}$ power terminal and the bonding pad 12 simultaneously, making the potential of the bonding pad 12 greater than the potential of the $V_{DD}$ power terminal, the first parasitic diode 26 is turned on to discharge the electrostatic charges quickly. When an user carrying electrostatic charges contacts the bonding pad 12 and the $V_{SS}$ power terminal simultaneously, making the potential of the bonding pad 12 greater than the potential of the $V_{SS}$ power terminal, a snapback breakdown of the NMOS 24 occurs to discharge the electrostatic charges quickly. The above mentioned snapback breakdown phenomenon can be referred to in U.S. Pat. No. 5,804,860. However, with the continuing scaling-down of semiconductor integrated circuit (IC) device dimensions, the gate oxide layer in a MOSFET is becoming thinner. As a result, the snapback breakdown phenomenon is difficult to control. In addition, many factors are involved in preventing ESD-related damage to the internal circuit and preventing the ESD protection circuit from being burnt-out due to a high ESD current. The spacing between drain and gate, the adapting of a salicide block (SAB), and the dopant concentration of wells all must be considered when designing the ESD protection circuit.

SUMMARY OF INVENTION

It is therefore a primary objective of the claimed invention to provide an ESD protection circuit, especially an ESD protection circuit that utilizes an equivalent zener diode, formed by a simpler ion implantation method, to provide a path to discharge ESD current.

According to the claimed invention, the ESD protection circuit is formed on a P-type substrate and is disposed between a bonding pad and an internal circuit formed on the P-type substrate. The ESD protection circuit is connected to the bonding pad, a first power supply terminal ($V_{DD}$) a second power supply terminal ($V_{SS}$) and the internal circuit and includes a P-type metal-oxide semiconductor (PMOS) and an N-type metal-oxide semiconductor (NMOS).

The PMOS includes a P+ guard ring, a first N+ diffusion region, a first N-well, and a first doped region. The P+ guard ring is formed on the P-type substrate. The first N+ diffusion region is formed on the P-type substrate and is surrounded by the P+ guard ring, but is not in contact with the P+ guard ring. The first N-well is formed on the P-type substrate and is contact with the first N+ diffusion region. The first doped region is formed below the P+ guard ring and the first N+ diffusion region, and is contact with the P+ guard ring and the first N+ diffusion region to form a first equivalent zener diode.

The NMOS includes an N+ guard ring, a first P+ diffusion region, a second N-well, and a second doped region. The N+ guard ring is formed on the P-type substrate. The first P+ diffusion region is formed on the P-type substrate and is surrounded by the N+ guard ring, but is not in contact with the N+ guard ring. The second well is formed below the N+ guard ring and is in contact with the N+ guard ring. The second doped region is formed below the N+ guard ring and the first P+ diffusion region, and is in contact with the N+ guard ring and the first P+ diffusion region to form a second equivalent zener diode.

It is an advantage of the claimed invention to utilize an ion implantation process to form the P-type doped region or the N-type doped region below the guard ring and the well pick-up. The equivalent zener diode is formed on the P-type substrate to discharge the ESD current. Additionally, the claimed invention ESD protection circuit is more easily made since it is not necessary to consider the various processing factors that affect the snapback breakdown phenomenon.

These and other objectives of the claimed invention will no doubt become obvious to those of ordinary skill in the art after having read the following detailed description of the preferred embodiment, which is illustrated in the various figures and drawings.

DETAILED DESCRIPTION

Figure 2:
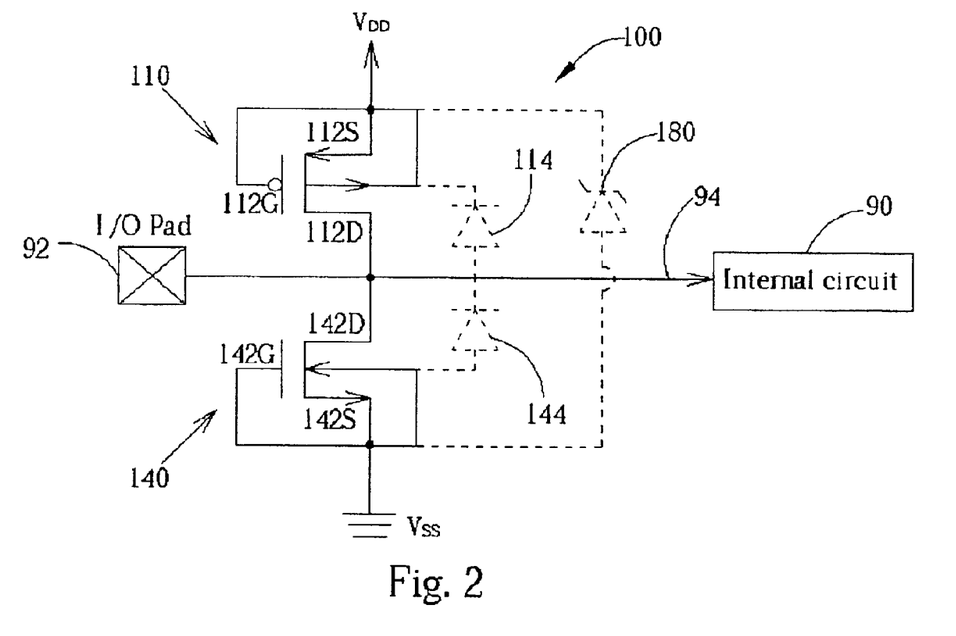
FIG. 2 is a circuit diagram of an ESD protection circuit connected to an internal circuit according to the present invention.
Figure 3:
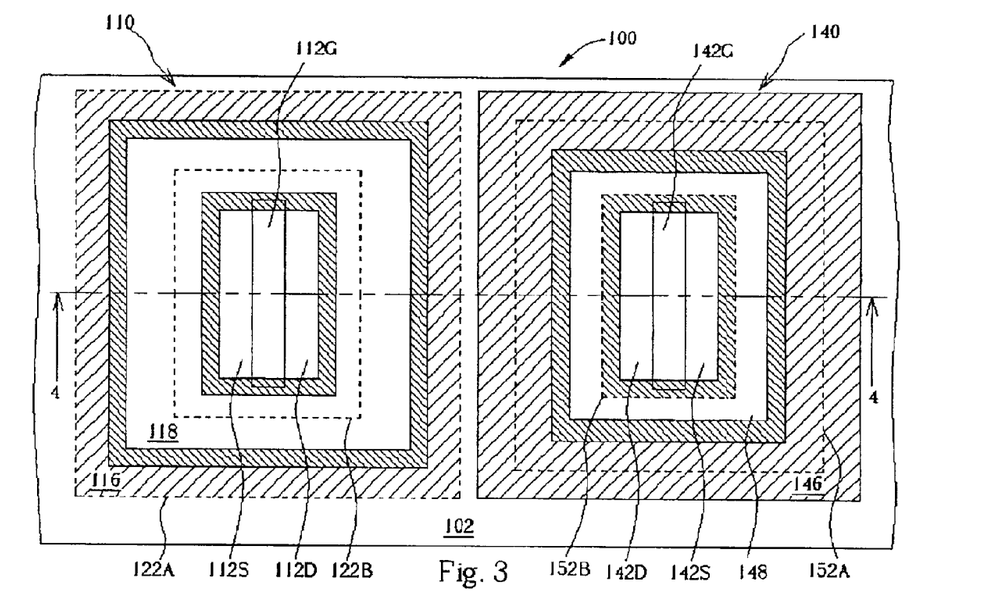
FIG. 3 is a top view of the ESD protection circuit of FIG. 2.

Please refer to FIG. 2 and FIG. 3. FIG. 2 is a circuit diagram of an ESD protection circuit 100 connected to an internal circuit 90 according to the present invention. FIG. 3 is a top view of the ESD protection circuit 100 of FIG. 2. The ESD protection circuit 100 is formed on a P-type substrate 102 and disposed between a bonding pad 92 and the internal circuit 90. The bonding pad 92 is utilized as a medium of electronic signals between the outside and the internal circuit 90. The relevant electronic signals are input to the internal circuit 90 or output from the internal circuit 90 through the bonding pad 92. The internal circuit 90 is also formed on the P-type substrate 102. The ESD protection circuit 100 is connected to the bonding pad 92, a first power supply terminal $V_{DD}$, a second power supply terminal $V_{SS}$, and the internal circuit 90. The first power supply terminal $V_{DD}$ is connected to a positive potential to supply electrical power to the internal circuit 90. The second power supply terminal $V_{SS}$ is connected to ground to provide each electronic device a reference grounding level. The internal circuit 90 is supplied with electrical power to operate regularly only when the potential of the first power supply terminal $V_{DD}$ is greater than the potential of the second power supply terminal $V_{SS}$.

The ESD protection circuit 100 comprises a P-type metal-oxide semiconductor (PMOS) 110 and an N-type metal-oxide semiconductor (NMOS) 140. Both the PMOS 110 and the NMOS 140 are formed on the P-type substrate 102. A first parasitic diode 114 is formed in the PMOS 110 and a second parasitic diode 144 is formed in the NMOS 140. Similarly to the prior art method, the two parasitic diodes 114, 144 are utilized as the prime protection device to discharge ESD current.

Figure 4:
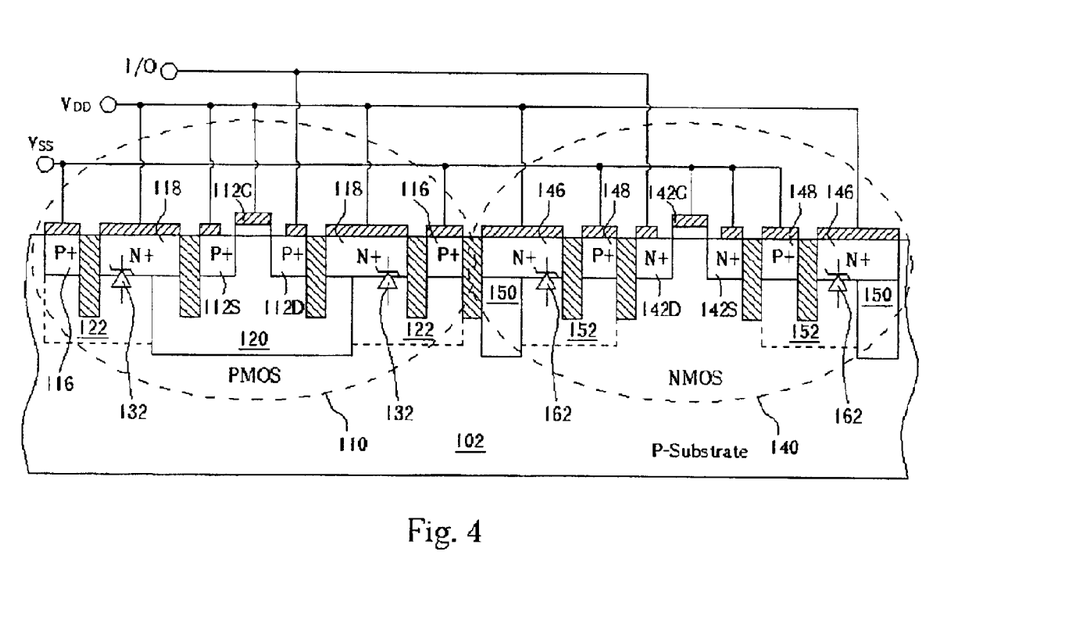
FIG. 4 is a cross-sectional schematic diagram of the ESD protection circuit along line 4—4 of FIG. 3.

Please refer to FIG. 3 and FIG. 4. FIG. 4 is a cross-sectional schematic diagram of the ESD protection circuit 100 along line 4—4 of FIG. 3. The PMOS 110 comprises a $P^+$ guard ring 116, a first $N^+$ diffusion region 118, a first N-well 120, a first P-type doped region 122, a gate 112G, a source 112S, and a drain 112D. The $P^+$ guard ring 116 is formed on the P-type substrate 102 and is connected to the second power supply terminal $V_{SS}$ to prevent latchup of the PMOS 110. The first $N^+$ diffusion region 118 is formed on the P-type substrate 102 and is surrounded by the $P^+$ guard ring 116, but is not in contact with the $P^+$ guard ring 116. The first N-well 120 is formed on the P-type substrate 102 and is in contact with the $N^+$ diffusion region 118. The first $N^+$ diffusion region 118 connects to the first power supply terminal $V_{DD}$ for use as a well pick-up so the first N-well 120 is not floating after a positive potential. The first P-type doped region 122 is formed below the $P^+$ guard ring 116 and the first $N^+$ diffusion region 118 and is in contact with both the $P^+$ guard ring 116 and the first $N^+$ diffusion region 118. Hence a first equivalent zener diode 132 is formed between the $P^+$ guard ring 116 and the first $N^+$ diffusion region 118. The first P-type doped region 122 is formed by $P^+$ ion implantation. As shown in FIG. 3, the area between the dashed lines 122A and 122B is the first P-type doped region 122 formed by $P^+$ ion implantation. The source 112S and the drain 112D of the PMOS 110 are formed by two $P^+$ diffusion regions located at opposing sides of the gate 112G, in the first N-well 120. A dielectric layer composed of silicon dioxide is formed on the surface of the N-well 120 for use as the gate oxide layer in the gate 112G. The source 112S and the gate 112G are tied together and are connected to the first power supply terminal $V_{DD}$.

In contrast with the PMOS 110, the NMOS 140 comprises an $N^+$ guard ring 146, a first $P^+$ diffusion region 148, a second N-well 150, a second P-type doped region 152, a gate 142G, a source 142S, and a drain 142D. The $N^+$ guard ring 146 is formed on the P-type substrate 102 and is connected to the first power supply terminal $V_{DD}$ to prevent latchupof the NMOS 140. The first $P^+$ diffusion region 148 is formed on the P-type substrate 102 and is surrounded by the $N^+$ guard ring 146, but does not contact the $N^+$ guard ring 146. The first $P^+$ diffusion region 148 connects to the second power supply terminal $V_{SS}$ so the floating body effect does not happen to the NMOS 140. The second N-well 150 is formed on the P-type substrate 102 and is in contact with the $N^+$ guard ring 146. The second P-type doped region 152 is formed below the $N^+$ guard ring 146 and the first $P^+$ diffusion region 148 and is in contact with both the $N^+$ guard ring 146 and the first $P^+$ diffusion region 148. Hence a second equivalent zener diode 162 is formed between the $N^+$ guard ring 146 and the first $P^+$ diffusion region 148. The second P-type doped region 152 is formed by $P^+$ ion implantation. As shown in FIG. 3, the area between the dashed lines 152A and 152B is the second P-type doped region 152 formed by $P^+$ ion implantation. The source 142S and the drain 142D of the NMOS 140 are formed by two $N^+$ diffusion regions, which are located at opposing sides of the gate 142G in the P-type substrate 102. The source 142S and the gate 142G of the NMOS 140 are tied together and are connected to the second power supply terminal $V_{SS}$. The drain 12D of the PMOS 110 and the drain 142D of the NMOS 140 are tied together and are connected to the bonding pad 92 and the internal circuit 90 via a conducting wire 94.

Since the sum of the forward voltage of the first parasitic diode 114 and the breakdown voltage of the first equivalent zener diode 132 is less than the snapback voltage of the PMOS 110, the first parasitic diode 114 and the first equivalent zener diode 132 are both turned on before the snapback breakdown of the PMOS 110 happens. Similarly, since the sum of the forward voltage of the second parasitic diode 144 and the breakdown voltage of the second equivalent zener diode 162 is less than the snapback voltage of the NMOS 140, the second parasitic diode 144 and the second equivalent zener diode 162 are both turned on before the snapback breakdown of the NMOS 140 happens. In addition, the P terminals of the two equivalent zener diodes 132,162 are both connected to the first power supply terminal $V_{DD}$ and the N terminals of the two equivalent zener diodes 132, 162 are both connected to the second power supply terminal $V_{SS}$. When the breakdown voltage of the first equivalent zener diode 132 is equivalent or close to the breakdown voltage of the second equivalent zener diode 162, the first equivalent zener diode 132 and the second equivalent zener diode 162 can be represented by another equivalent zener diode 180 as shown in FIG. 2. To make the ESD protection circuit 100 more easily understood the following description is illustrated with the equivalent zener diode 180 instead of the two equivalent zener diodes 132, 162.

When electrostatic charges enter the ESD protection circuit 100 through the bonding pad 92, the situation generally falls into one of four different categories:1.the potential of the bonding pad 92 is greater than the potential of the first power supply terminal $V_{DD}$;2.the potential of the bonding pad 92 is less than the potential of the first power supply terminal $V_{DD}$;3.the potential of the bonding pad 92 is greater than the potential of the second power supply terminal $V_{SS}$;4.the potential of the bonding pad 92 is less than the potential of the second power terminal $V_{SS}$.

Under the first circumstance, the ESD current is discharged from the bonding pad 92 to the first power supply terminal $V_{DD}$ through the first parasitic diode 114. Under the second circumstance, the ESD current is discharged from the first power supply terminal $V_{DD}$ to the bonding pad 92 through the equivalent zener diode 180 and the second parasitic diode 144 in sequence. Under the third circumstance, the ESD current is discharged from the bonding pad 92 to the second power supply terminal $V_{SS}$ through the first parasitic diode 114 and the equivalent zener diode 180. Under the fourth circumstance, the ESD current is discharged from the second power supply terminal $V_{DD}$ to the bonding pad 92 through the second parasitic diode 144. The sum of the forward voltage of the first parasitic diode 114 and the breakdown voltage of the first equivalent zener diode 132 is less than the snapback voltage of the PMOS 110. The sum of the forward voltage of the second parasitic diode 144 and the breakdown voltage of the second equivalent zener diode 162 is less than the snapback voltage of the NMOS 140. The equivalent zener diode 180 is comparable to the two equivalent zener diodes 132 and 136. Turning on the two parasitic diodes 114 and 144 and the two equivalent zener diodes 132 and 162 prevents the snapback breakdown phenomena of the PMOS 110 and the NMOS 140. Therefore, the ESD protection circuit 100 is able to prevent the internal circuit 90 from the ESD-related damage.

Figure 5:
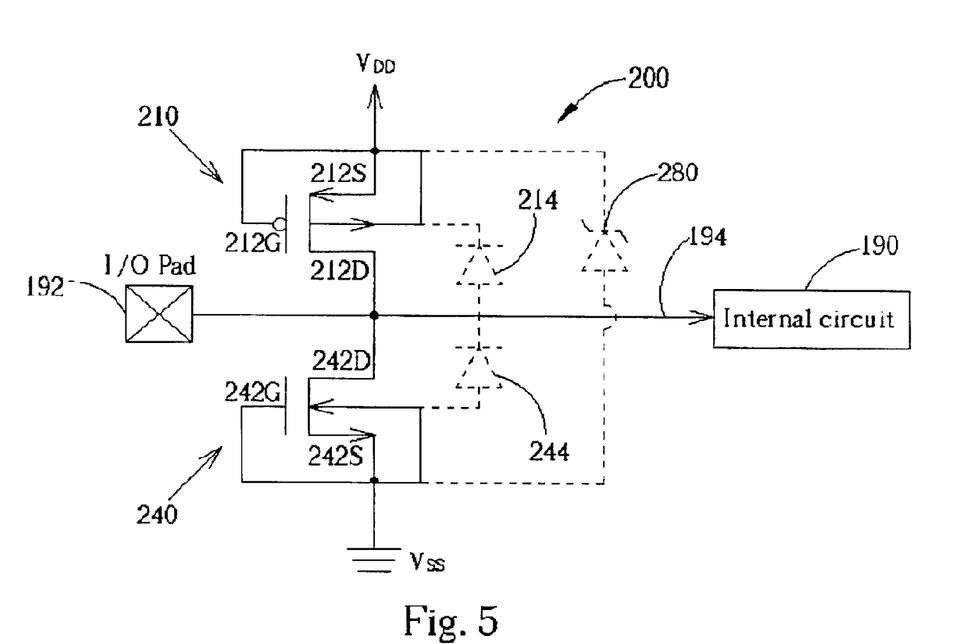
FIG. 5 is a circuit diagram of an ESD protection circuit connected to an internal circuit according to the second preferred embodiment of the present invention.
Figure 6:
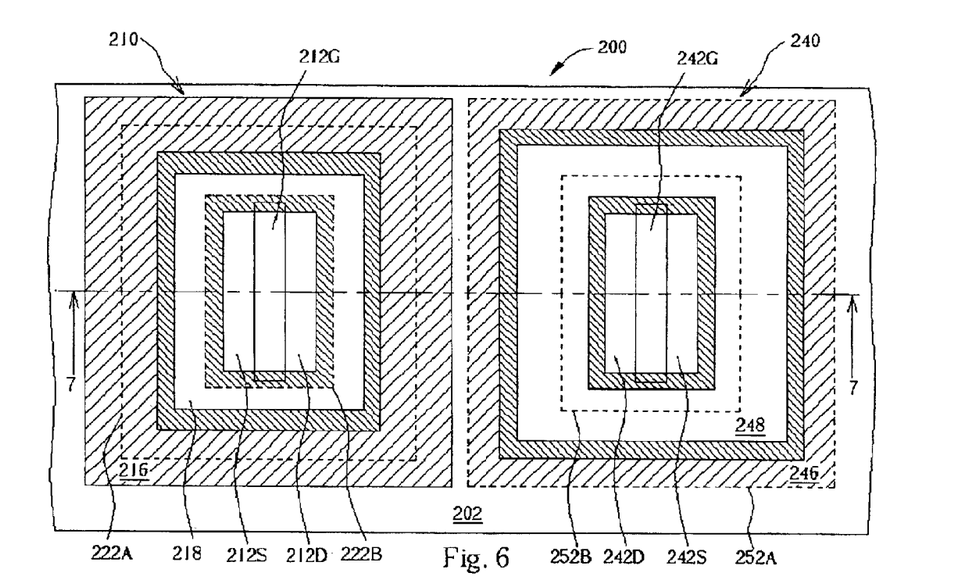
FIG. 6 is a top view of the ESD protection circuit of FIG. 5.

Please refer to FIG. 5 and FIG. 6. FIG. 5 is a circuit diagram of another ESD protection circuit 200 connected to an internal circuit 190 according to the present invention. FIG. 6 is a top view of the ESD protection circuit 200 of FIG. 5. The ESD protection circuit 200 is formed on a P-type substrate 202 and disposed between a bonding pad 192 and the internal circuit 190. The bonding pad 192 is utilized as a medium of electronic signals between the outside and the internal circuit 190. The relevant electronic signals are input to the internal circuit 190 or output from the internal circuit 190 through the bonding pad 192. The internal circuit 190 is also formed on the P-type substrate 202. The ESD protection circuit 200 connects to the bonding pad 192, a first power supply terminal $V_{DD}$, a second power supply terminal $V_{SS}$ and the internal circuit 190. The first power supply terminal $V_{DD}$ is connected to a positive potential to supply electrical power to the internal circuit 190. The second power supply terminal $V_{SS}$ is connected to ground to provide each electronic device a reference grounding level. The internal circuit 190 is supplied with electrical power to operate regularly only when the potential of the first power supply terminal $V_{DD}$ is greater than the potential of the second power supply terminal $V_{SS}$.

The ESD protection circuit 200 comprises a P-type metal-oxide semiconductor (PMOS) 210 and an N-type metal-oxide semiconductor (NMOS) 240. Both the PMOS 210 and the NMOS 240 are formed on the P-type substrate 202. A first parasitic diode 214 is formed in the PMOS 210 and a second parasitic diode 244 is formed in the NMOS 240. Similarly to the prior art method, the two parasitic diodes 214, 244 are utilized as the prime protection device to discharge ESD current.

Figure 7:
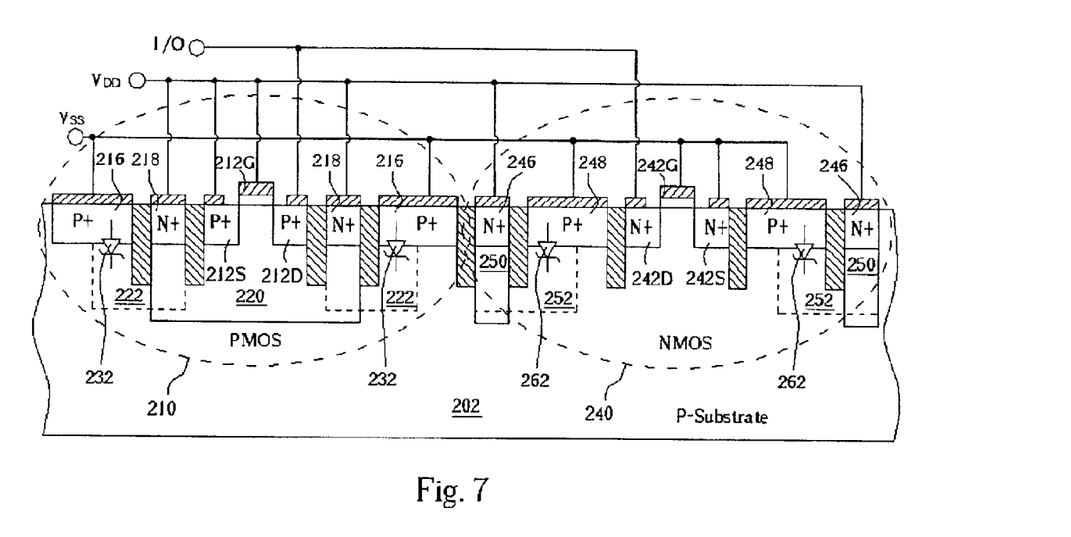
FIG. 7 is a cross-sectional schematic diagram of the ESD protection circuit along line 7—7 of FIG. 6.

Please refer to FIG. 6 and FIG. 7. FIG. 6 is a cross-sectional schematic diagram of the ESD protection circuit 200 along line 7—7 of FIG. 6. The PMOS 210 comprises a $P^+$ guard ring 216, a first $N^+$ diffusion region 218, a first N-well 220, a first N-type doped region 222, a gate 212G, a source 212S, and a drain 212D. The $P^+$ guard ring 216 is formed on the P-type substrate 202 and is connected to the second power supply terminal $V_{DD}$ to prevent latchup of the PMOS 210. The first $N^+$ diffusion region 218 is formed on the P-type substrate 202 and is surrounded by the $P^+$ guard ring 216, but is not in contact with the $P^+$ guard ring 216. The first N-well 220 is formed on the P-type substrate 202 and is in contact with the first $N^+$ diffusion region 218. The first $N^+$ diffusion region 218 connects to the first power supply terminal $V_{DD}$ for use as a well pick-up so the first N-well 220 is not floating after a positive potential. The first N-type doped region 222, formed below the $P^+$ guard ring 216 and the first $N^+$ diffusion region 218, is in contact with both the $P^+$ guard ring 216 and the first $N^+$ diffusion region 218. A portion of the first N-well 220 overlaps the first N-type doped region 222. Hence a first equivalent zener diode 232 is formed between the $P^+$ guard ring 216 and the first $N^+$ diffusion region 218. The first N-type doped region 222 is formed by $N^+$ ions implantation. As shown in FIG. 6, the area between the dashed lines 222A and 222B is the first N-type doped region 222 formed by $N^+$ ion implantation. The source 212S and the drain 212D of the PMOS 210 are formed by two $P^+$ diffusion regions, which are located at opposing sides of the gate 212G, in the first N-well 220. A dielectric layer composed of silicon dioxide is formed on the surface of the N-well 220 for use as the gate oxide layer in the gate 212G. The source 212S and the gate 212G are tied together and are connected to the first power supply terminal $V_{DD}$.

In contrast with the PMOS 210, the NMOS 240 comprises an $N^+$ guard ring 246, a first $P^+$ diffusion region 248, a second N-well 250, a second N-type doped region 252, a gate 242G, a source 242S, and a drain 242D. The $N^+$ guard ring 246 is formed on the P-type substrate 202 and is connected to the first power supply terminal $V_{DD}$ to prevent latchup of the NMOS 240. The first $P^+$ diffusion region 248 is formed on the P-type substrate 202 and is surrounded by the $N^+$ guard ring 246, but is not in contact with the $N^+$ guard ring 246. The first $P^+$ diffusion region 248 connects to the second power supply terminal $V_{SS}$ so the floating body effect does not happen to the NMOS 240. The second N-well 250 is formed on the P-type substrate 202 and is in contact with the N+ guard ring 246. The second N-type doped region 252, formed below the N+ guard ring 246 and the first P+ diffusion region 248, is in contact with both the N+ guard ring 246 and the first P+ diffusion region 248. A portion of the second N-well 250 overlaps the second N-type doped region 252. Hence a second equivalent zener diode 262 is formed between the N+ guard ring 246 and the first P+diffusion region 248. The second N-type doped region 252 is formed by N+ ion implantation. As shown in FIG. 6, the area between the dashed lines 252A and 252B is the second N-type doped region 252 formed by N+ ion implantation. The source 242S and the drain 242D of the NMOS 240 are formed by two N+ diffusion regions, which are located at opposing sides of the gate 242G, in the P-type substrate 202. The source 242S and the gate 242G of the NMOS 240 are tied together and are connected to the second power supply terminal $V_{SS}$. The drain 212D of the PMOS 210 and the drain 242D of the NMOS 240 are tied together and connected to the bonding pad 192 and the internal circuit 190 via a conducting wire 194.

Since the sum of the forward voltage of the first parasitic diode 214 and the breakdown voltage of the first equivalent zener diode 232 is less than the snapback voltage of the PMOS 210, the first parasitic diode 214 and the first equivalent zener diode 232 are both turned on before the snapback breakdown of the PMOS 210 happens. Similarly, since the sum of the forward voltage of the second parasitic diode 244 and the breakdown voltage of the second equivalent zener diode 262 is less than the snapback voltage of the NMOS 240, the second parasitic diode 244 and the second equivalent zener diode 262 are both turned on before the snapback breakdown of the NMOS 240 happens. In addition, the P terminals of the two equivalent zener diodes 232, 262 are both connected to the second power supply terminal $V_{SS}$ and the N terminals of the two equivalent zener diodes 232, 262 are both connected to the first power supply terminal $V_{DD}$ When the breakdown voltage of the first equivalent zener diode 232 is equivalent or close to the breakdown voltage of the second equivalent zener diode 262, the first equivalent zener diode 232 and the second equivalent zener diode 262 can be represented by another equivalent zener diode 280 as shown in FIG. 5. Similarly to the ESD protection circuit 100, turning on the two parasitic diodes 214 and 244 and the two equivalent zener diodes 232 and 262 prevents the snapback breakdown phenomena of the PMOS 210 and the NMOS 240, and the ESD protection circuit 200 is able to protect the internal circuit 190 from ESD-related damage.

In contrast to the prior art ESD protection circuits, which is difficult to be made when considering the various factors affecting the snapback breakdown phenomenon, a P-type doped region or an N-type doped region is formed below the guard ring and the well pick-up by ion implantation according to the ESD protection circuit of the present invention. An equivalent zener diode is thusly formed on the P-type substrate to discharge the ESD current.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An electrostatic discharge (ESD) protection circuit formed on a P-type substrate and disposed between a bonding pad and an internal circuit on the P-type substrate for protecting the internal circuit from electrostatic discharge, the ESD protection circuit being electrically connected to the internal circuit, a first power supply terminal, a second power supply terminal, and the bonding pad, the ESD protection circuit comprising:
   a P-type metal-oxide semiconductor (PMOS) formed on the P-type substrate, the PMOS comprising:
      a P+ guard ring formed on the P-type substrate and electrically connecting to the second power supply terminal;
      a first N+ diffusion region formed on the P-type substrate and surrounded by the P+ guard ring without contact with the P+ guard ring, the N+ diffusion region electrically connecting to the first power supply terminal;
      a first N-well formed on the P-type substrate and contacting with the first N+ diffusion region; and
      a first doped region formed below the P+ guard ring and the first N+ diffusion region, and contacting with the P+ guard ring and the first N+ diffusion region to form a first equivalent Zener diode; and
   an N-type metal-oxide semiconductor (NMOS) formed on the P-type substrate, the NMOS comprising:
      an N+ guard ring formed on the P-type substrate and electrically connected to the first power supply terminal;
      a first P+ diffusion region formed on the P-type substrate and surrounded by the N+ guard ring without contact with the N+ guard ring, the P+ diffusion region electrically connecting to the second power supply terminal; and
      a second N-well formed below the N+ guard ring and contacting with the N+ guard ring.

2. The ESD protection circuit of claim 1 wherein the NMOS further comprises a second doped region formed below the N+ guard ring and the first P+ diffusion region, and the second doped region contacts with the N+ guard ring and the first P+ diffusion region to form a second equivalent Zener diode.

3. The ESD protection circuit of claim 2 wherein a breakdown of the first equivalent Zener diode or a breakdown of the second equivalent Zener diode restricts the PMOS and the NMOS from producing a snapback breakdown.

4. The ESD protection circuit of claim 2 wherein the first doped region and the second doped region are two P-type doped regions.

5. The ESD protection circuit of claim 2 wherein the first doped region and the second doped region are two N-type doped regions.

6. The ESD protection circuit of claim 5 wherein the first doped region overlaps the first N-well, and the second doped region overlaps the second N-well.

7. The ESD protection circuit of claim 1 wherein a breakdown of the first equivalent Zener diode restricts the PMOS and the NMOS from producing a snapback breakdown.

8. The ESD protection circuit of claim 1 wherein when a potential of the first power supply terminal is greater than a potential of the second power supply terminal, the internal circuit is supplied with electrical power.

9. The ESD protection circuit of claim 1 wherein a gate of the PMOS connects to a source of the PMOS, a gate of the NMOS connects to a source of the NMOS, and a drain of the PMOS and a drain of the NMOS electrically connect to the bonding pad and the internal circuit via a conducting wire.

10. The ESD protection circuit of claim 9 wherein the source of the PMOS electrically connects to the first power supply terminal, and the source of the NMOS electrically connects to the second power supply terminal.

11. An electrostatic discharge (ESD) protection circuit formed on a P-type substrate and disposed between a bonding pad and an internal circuit on the P-type substrate for protecting the internal circuit from electrostatic discharge, the ESD protection circuit being electrically connected to the internal circuit, a first power supply terminal, a second power supply terminal, and the bonding pad, the ESD protection circuit comprising:

a P-type metal-oxide semiconductor (PMOS) formed on the P-type substrate, the PMOS comprising:
 a $P^+$ guard ring formed on the P-type substrate and electrically connecting to the second power supply terminal;
 a first $N^+$ diffusion region formed on the P-type substrate and surrounded by the $P^+$ guard ring without contact with the $P^+$ guard ring, the $N^+$ diffusion region electrically connecting to the first power supply terminal; and
 a first N-well formed on the P-type substrate and contacting with the first $N^+$ diffusion region; and an N-type metal-oxide semiconductor (NMOS) formed on the P-type substrate, the NMOS comprising:
 an $N^+$ guard ring formed on the P-type substrate and electrically connected to the first power supply terminal;
 a first $P^+$ diffusion region formed on the P-type substrate and surrounded by the $N^+$ guard ring without contact with the $N^+$ guard ring, the $P^+$ diffusion region electrically connecting to the second power supply terminal;
 a second N-well formed below the $N^+$ guard ring and contacting with the $N^+$ guard ring; and
 a second doped region formed below the $N^+$ guard ring and the first $P^+$ diffusion region, and contacting with the $N^+$ guard ring and the first $P^+$ diffusion region to form a second equivalent Zener diode.

12. The ESD protection circuit of claim 11 wherein the PMOS further comprises a first doped region formed below the $P^+$ guard ring and the first $N^+$ diffusion region, and the first doped region contacts with the $P^+$ guard ring and the first $N^+$ diffusion region to form a first equivalent Zener diode.

13. The ESD protection circuit of claim 12 wherein a breakdown of the first equivalent Zener diode or a breakdown of the second equivalent Zener diode restricts the PMOS and the NMOS from producing a snapback breakdown.

14. The ESD protection circuit of claim 12 wherein the first doped region and the second doped region are two P-type doped regions.

15. The ESD protection circuit of claim 12 wherein the first doped region and the second doped region are two N-type doped regions.

16. The ESD protection circuit of claim 15 wherein the first doped region overlaps the first N-well, and the second doped region overlaps the second N-well.

17. The ESD protection circuit of claim 11 wherein a breakdown of the second equivalent Zener diode restricts the PMOS and the NMOS from producing a snapback breakdown.

18. The ESD protection circuit of claim 11 wherein when a potential of the first power supply terminal is greater than a potential of the second power supply terminal, the internal circuit is supplied with electrical power.

19. The ESD protection circuit of claim 11 wherein a gate of the PMOS connects to a source of the PMOS, a gate of the NMOS connects to a source of the NMOS, and a drain of the PMOS and a drain of the NMOS electrically connect to the bonding pad and the internal circuit via a conducting wire.

20. The ESD protection circuit of claim 19 wherein the source of the PMOS electrically connects to the first power supply terminal, and the source of the NMOS electrically connects to the second power supply terminal.

* * * * *